(12) United States Patent
Nakamura

(10) Patent No.: US 7,507,639 B2
(45) Date of Patent: Mar. 24, 2009

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 287 days.

(21) Appl. No.: 11/633,056

(22) Filed: Dec. 4, 2006

(65) Prior Publication Data
US 2007/0128767 A1    Jun. 7, 2007

(30) Foreign Application Priority Data
Dec. 6, 2005    (JP)    ............................. 2005-352435

(51) Int. Cl.
*H01L 21/78*    (2006.01)
(52) U.S. Cl. ................. 438/463; 438/464; 257/E21.599
(58) Field of Classification Search .................. 438/463
See application file for complete search history.

(56) References Cited

U.S. PATENT DOCUMENTS

| | | | |
|---|---|---|---|
| 6,176,966 B1 * | 1/2001 | Tsujimoto et al. ........... | 156/344 |
| 7,329,564 B2 * | 2/2008 | Nakamura et al. .......... | 438/113 |
| 2005/0170616 A1 * | 8/2005 | Murata et al. ................ | 438/463 |
| 2005/0215033 A1 * | 9/2005 | Yamamoto et al. .......... | 438/464 |
| 2006/0084239 A1 * | 4/2006 | Nagai et al. .................. | 438/460 |
| 2007/0128834 A1 * | 6/2007 | Nakamura .................... | 438/460 |

FOREIGN PATENT DOCUMENTS

JP    3408805 B2    3/2003

* cited by examiner

*Primary Examiner*—Stephen W Smoot
(74) *Attorney, Agent, or Firm*—Smith, Gambrell & Russell, LLP

(57) ABSTRACT

A method of dividing a wafer having devices formed in a plurality of areas sectioned by a plurality of dividing lines, into individual chips along the dividing lines, comprising a deteriorated layer forming step for forming a deteriorated layer by applying a laser beam of a wavelength having permeability for the wafer along the dividing lines; a wafer supporting step for putting the rear surface of the wafer on the surface of an adhesive tape which is mounted on an annular frame and whose adhesive strength is reduced by applying ultraviolet radiation thereto; and a chips-spacing forming step for reducing the adhesive strength of the adhesive tape and shrinking a shrink area between the inner periphery of the annular frame and the area to which the wafer has been affixed, of the adhesive tape by applying ultraviolet radiation to the adhesive tape to which the wafer has been affixed so as to divide the wafer into individual chips along the dividing lines where the deteriorated layer has been formed and widen the space between adjacent chips.

2 Claims, 7 Drawing Sheets

(a)

(b)

WAFER DIVIDING METHOD

FIELD OF THE INVENTION

The present invention relates to a method of dividing a wafer having a plurality of dividing lines which are formed in a lattice pattern on the front surface and devices which are formed in a plurality of areas sectioned by the plurality of dividing lines, into individual chips along the dividing lines.

DESCRIPTION OF THE PRIOR ART

In the production process of a semiconductor device, a plurality of areas are sectioned by dividing lines called "streets" which are arranged in a lattice pattern on the front surface of a substantially disk-like semiconductor wafer, and a device such as IC or LSI is formed in each of the sectioned areas. Individual semiconductor chips are manufactured by cutting this semiconductor wafer along the dividing lines to divide it into the areas having each a device formed therein. An optical device wafer comprising a gallium nitride-based compound semiconductor laminated on the front surface of a sapphire substrate is also cut along predetermined dividing lines to be divided into individual optical devices such as light emitting diodes or laser diodes, which are widely used in electric appliances.

Cutting along the dividing lines of the above semiconductor wafer or optical device wafer is generally carried out by a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means has a rotary spindle, a cutting blade mounted on the spindle and a drive mechanism for rotary-driving the rotary spindle. The cutting blade comprises a disk-like base and an annular cutting-edge which is mounted on the side wall outer peripheral portion of the base and formed as thick as about 20 μm by fixing diamond abrasive grains having a diameter of about 3 μm to the base by electroforming.

Since a sapphire substrate, silicon carbide substrate, etc. have high Mohs hardness, however, cutting with the above cutting blade is not always easy. Since the cutting blade has a thickness of about 20 μm, the dividing lines for sectioning devices must have a width of about 50 μm. Therefore, in the case of a device measuring, for example, about 300 μm×300 μm, the area ratio of the dividing lines to the wafer becomes 14%, thereby reducing productivity.

Meanwhile, as a means of dividing a plate-like workpiece such as a semiconductor wafer, Japanese Patent No. 3408805 discloses a laser processing method for applying a pulse laser beam of a wavelength having permeability for the workpiece with its focal point set to the inside of the area to be divided. In the dividing method making use of this laser processing technique, the workpiece is divided by applying a pulse laser beam of an infrared range having permeability for the workpiece from one side of the workpiece with its focal point set to the inside to continuously form a deteriorated layer in the inside of the workpiece along the dividing lines and exerting external force along the dividing lines whose strength has been reduced by the formation of the deteriorated layers.

To divide the semiconductor wafer along the dividing lines, the semiconductor wafer is divided in a state where it is put on the surface of an adhesive tape mounted on an annular frame so that the obtained chips do not fall apart. Therefore, when the wafer is divided by the dividing method disclosed by the above publication, a problem arises that there is no space between the chips and the chips are in close contact with one another, whereby adjacent chips are rubbed with each other during conveyance and consequently, damaged.

To solve this problem, the assignee company of the present invention proposes as Japanese patent application No. 2004-300384 a method of dividing a wafer, comprising the steps of putting a wafer having the above deteriorated layers on the surface of an adhesive tape which is mounted on an annular frame and shrinks by an external stimulus, dividing the wafer along the dividing lines where the deteriorated layer has been formed, then exerting an external stimulus to the shrink area between the inner periphery of the annular frame and the area to which the wafer has been affixed, of the adhesive tape to shrink it so as to expand the space between adjacent chips.

However, a special apparatus is required to exert an external stimulus to the shrink area between the inner periphery of the annular frame and the area to which the wafer has been affixed, of the adhesive tape and the adhesive strength of the adhesive tape must be reduced by applying ultraviolet radiation to the adhesive tape when chips are picked up from the adhesive tape to be die bonded, thereby increasing the number of steps with the result of reduced productivity.

SUMMARY OF THE INVENTION

It is an object of the present invention to provide a method of dividing a wafer having a plurality of dividing lines which are formed in a lattice pattern on the front surface and devices which are formed in a plurality of areas sectioned by the plurality of dividing lines, into individual chips along the dividing lines, wherein the obtained individual chips can be held with a predetermined space therebetween without using a special apparatus or without increasing the number of steps.

To attain the above object of the present invention, according to the present invention, there is provided a method of dividing a wafer having a plurality of dividing lines which are formed in a lattice pattern on the front surface and devices which are formed in a plurality of areas sectioned by the plurality of dividing lines, into individual chips along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto after the deteriorated layer forming step; and a chips-spacing forming step for reducing the adhesive strength of the adhesive tape and shrinking a shrink area between the inner periphery of the annular frame and the area to which the wafer has been affixed, of the adhesive tape by applying ultraviolet radiation to the adhesive tape to which the wafer having the deteriorated layers along the dividing lines has affixed so as to divide the wafer into individual chips along the dividing lines where the deteriorated layer has been formed, and widen the space between adjacent chips.

According to the present invention, there is further provided a method of dividing a wafer having a plurality of dividing lines which are formed in a lattice pattern on the front surface and devices which are formed in a plurality of areas sectioned by the plurality of dividing lines, into individual chips along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is mounted on an annular frame and whose adhesive strength is reduced by applying ultraviolet radiation thereto after the deteriorated layer forming step;

a wafer dividing step for dividing the wafer into individual chips along the dividing lines where the deteriorated layer has been formed by exerting external force to the wafer on the adhesive tape; and a chips-spacing forming step for reducing the adhesive strength of the adhesive tape and shrinking a shrink area between the inner periphery of the annular frame and the area to which the wafer has been affixed, of the adhesive tape by applying ultraviolet radiation to the adhesive tape to which the wafer divided into individual chips along the dividing lines has been affixed so as to widen the space between adjacent chips.

In the wafer dividing method of the present invention, ultraviolet radiation is applied to the adhesive tape to which the wafer in which the deteriorated layer has been formed along the dividing lines has been affixed to reduce the adhesive strength of the adhesive tape and shrink the shrink area between the inner periphery of the annular frame and the area to which the wafer has been affixed, of the adhesive tape, thereby dividing the wafer into individual chips along the dividing lines where the deteriorated layer has been formed and widening the space between adjacent chips, or widening the space between adjacent chips after the wafer has been divided into individual chips. Therefore, a special apparatus for shrinking the shrink area of the adhesive tape is not required.

DETAILED DESCRIPTION OF THE PREFERRED EMBODIMENTS

Preferred embodiments of the wafer dividing method of the present invention will be described in detail hereinunder with reference to the accompanying drawings.

Figure 1:
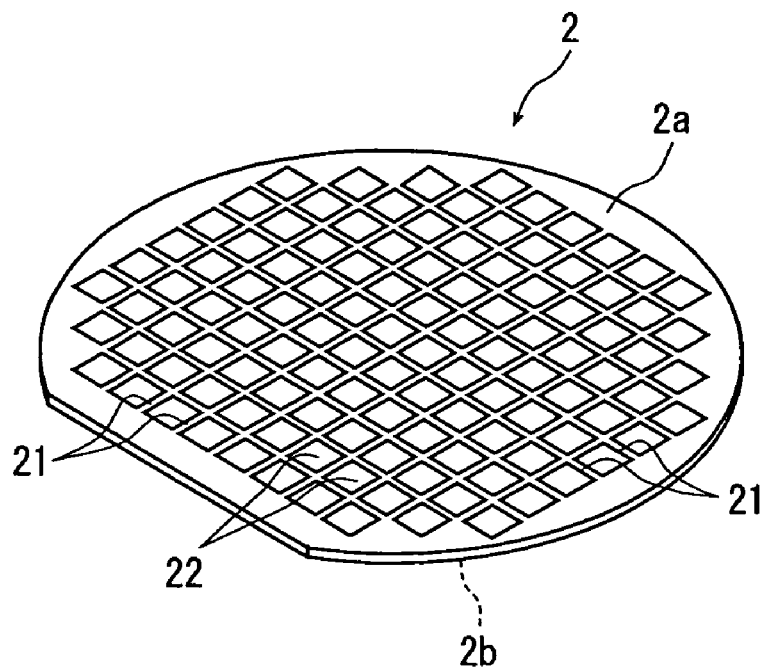
FIG. 1 is a perspective view of a semiconductor wafer to be divided into individual chips by the wafer dividing method of the present invention.

FIG. 1 is a perspective view of a semiconductor wafer as a wafer to be divided by the wafer dividing method of the present invention. The semiconductor wafer 2 shown in FIG. 1 is, for example, a silicon wafer having a thickness of 300 µm, and a plurality of dividing lines 21 are formed in a lattice pattern on the front surface 2a. A device 22 such as IC or LSI is formed in a plurality of areas sectioned by the plurality of dividing lines 21 on the front surface 2a of the semiconductor wafer 2. The method of dividing this semiconductor wafer 2 into individual semiconductor chips will be described hereinunder.

Figure 2:
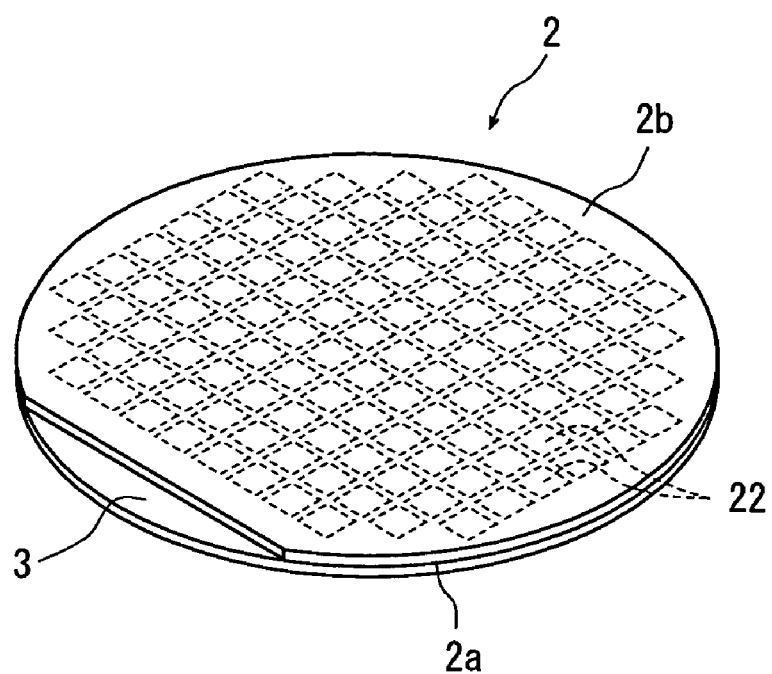
FIG. 2 is a perspective view showing a state of the semiconductor wafer shown in FIG. 1 having a protective member on the front surface.

A protective member 3 is affixed to the front surface 2a of the above-described semiconductor wafer 2 as shown in FIG. 2 (protective member affixing step).

After the protective member 3 is affixed to the front surface 2a of the semiconductor wafer 2 by carrying out the above protective member affixing step, next comes the step of forming a deteriorated layer in the inside of the semiconductor wafer 2 along the dividing lines 21 by applying a pulse laser beam having permeability for a silicon wafer from the rear surface 2b of the semiconductor wafer 2 along the dividing lines 21 so as to reduce strength along the dividing lines 21. This deteriorated layer forming step is carried out by using a laser beam processing machine 4 shown in FIG. 3. The laser beam processing machine 4 shown in FIG. 3 comprises a chuck table 41 for holding a workpiece, a laser beam application means 42 for applying a laser beam to the workpiece held on the chuck table 41, and an image pick-up means 43 for picking up an image of the workpiece held on the chuck table 41. The chuck table 41 is designed to suction-hold the workpiece and to be moved in a processing-feed direction indicated by an arrow X and an indexing-feed direction indicated by an arrow Y in FIG. 3 by a moving mechanism that is not shown.

The above laser beam application means 42 has a cylindrical casing 421 arranged substantially horizontally. In the casing 421, there is installed a pulse laser beam oscillation means (not shown) which comprises a pulse laser beam oscillator composed of a YAG laser oscillator or YVO4 laser oscillator and a repetition frequency setting means. A condenser 422 for converging a pulse laser beam oscillated from the pulse laser beam oscillation means is attached to the end of the above casing 421.

An image pick-up means 43 mounted on the end portion of the casing 421 constituting the above laser beam application means 42 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown.

Figure 4:
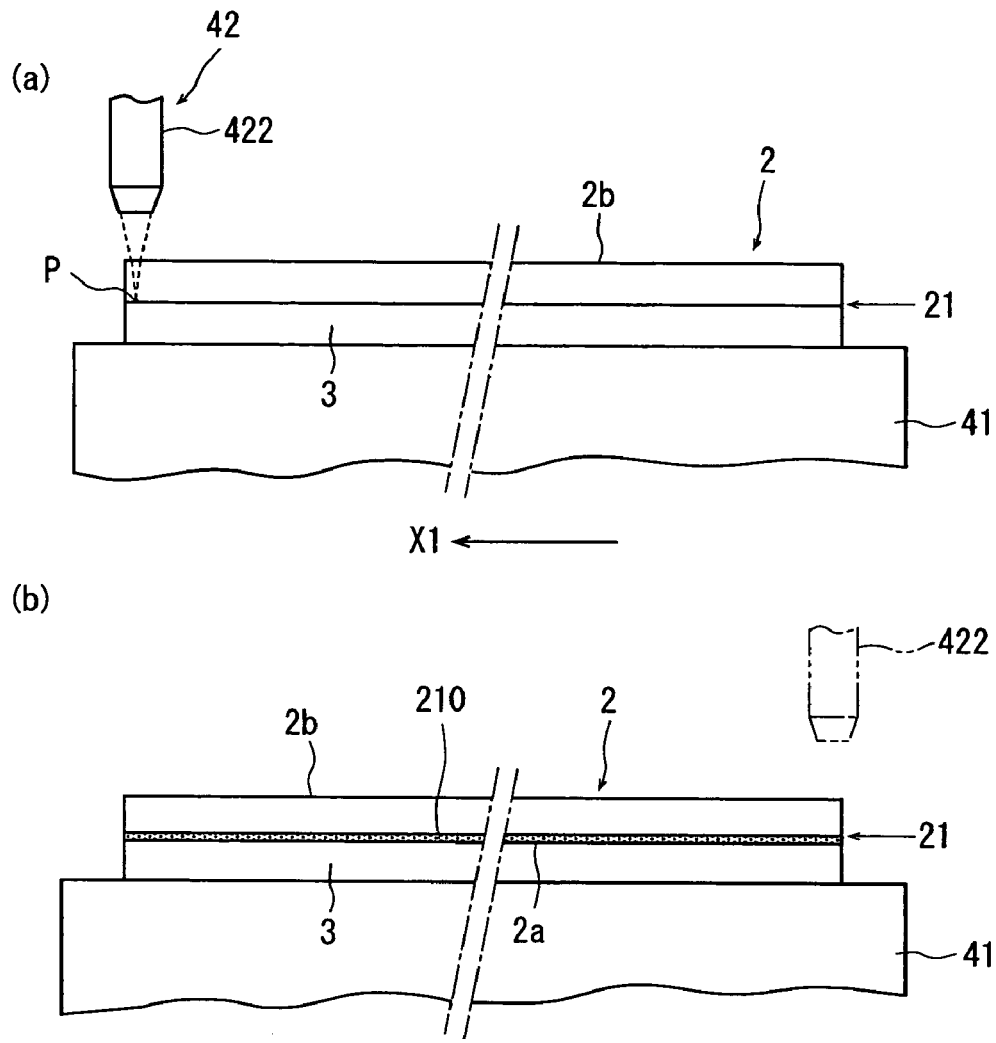
FIGS. 4(a) and 4(b) are explanatory diagrams showing the deteriorated layer forming step in the wafer dividing method of the present invention.
Figure 5:
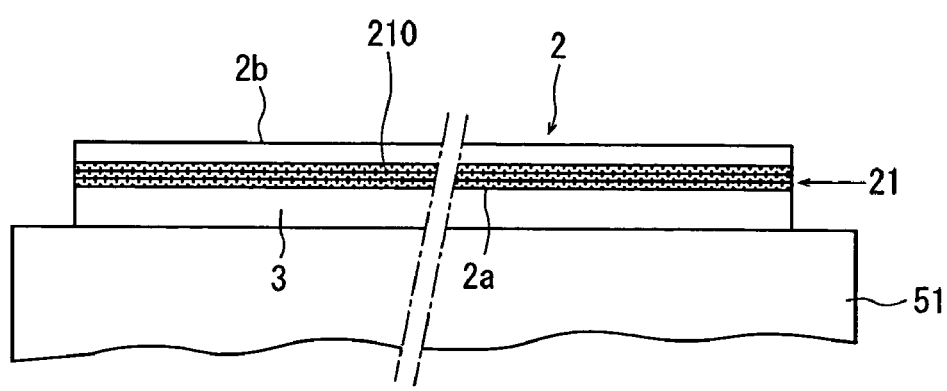
FIG. 5 is an explanatory diagram showing a state where deteriorated layers are laminated in the inside of the semiconductor wafer in the deteriorated layer forming step shown in FIGS. 4(a) and 4(b)

The deteriorated layer forming step which is carried out by using the above laser beam processing machine 4 will be described with reference to FIGS. 3 to 5.

Figure 3:
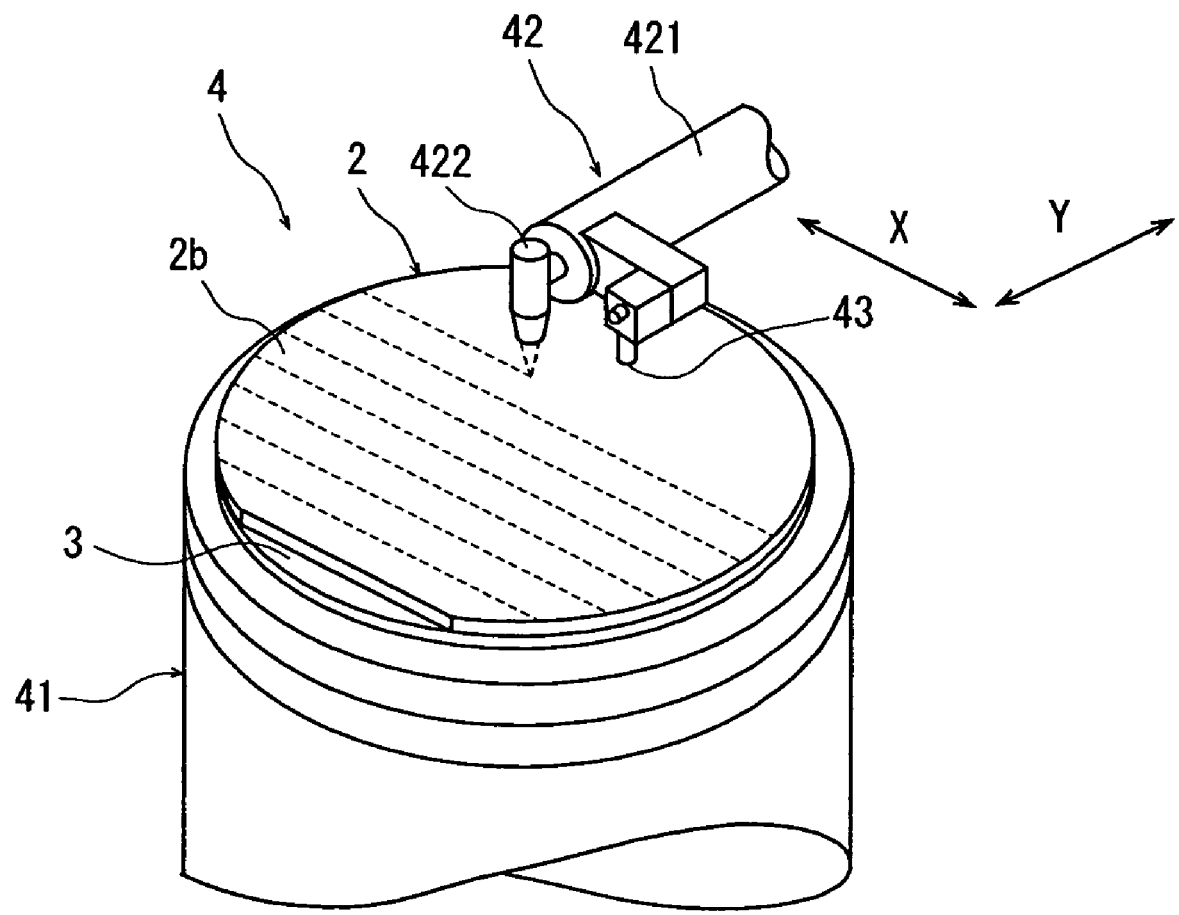
FIG. 3 is a perspective view of the principal section of a laser beam processing machine for carrying out the deteriorated layer forming step in the wafer dividing method of the present invention.

In this deteriorated layer forming step, the protective member 3 side of the semiconductor wafer 2 is first placed on the chuck table 41 of the laser beam processing machine 4 shown in FIG. 3 (therefore, the rear surface 2b of the semiconductor wafer 2 faces up), and the semiconductor wafer 2 is suction-held on the chuck table 41 by a suction means that is not shown. The chuck table 41 suction-holding the semiconductor wafer 2 is brought to a position right below the image pick-up means 43 by the moving mechanism that is not shown.

After the chuck table 41 is positioned right below the image pick-up means 43, alignment work for detecting the area to be processed of the semiconductor wafer 2 is carried out by the image pick-up means 43 and the control means that is not shown. That is, the image pick-up means 43 and the control means (not shown) carry out image processing such as pattern matching, etc. to align a dividing line 21 formed in a predetermined direction of the semiconductor wafer 2 with the condenser 422 of the laser beam application means 42 for applying a laser beam along the dividing line 21, thereby performing the alignment of a laser beam application position. The alignment of the laser beam application position is also carried out on dividing lines 21 formed on the semiconductor wafer 2 in a direction perpendicular to the above predetermined direction. Although the front surface 2a having the dividing lines 21 formed thereon of the semiconductor wafer 2 faces down at this point, as the image pick-up means 43 comprises an infrared illuminating means, an optical system for capturing infrared radiation and an image pick-up device (infrared CCD) for outputting an electric signal corresponding to the infrared radiation as described above, images of the dividing lines 21 can be picked up through the rear surface 2b.

After the dividing line 21 formed on the semiconductor wafer 2 held on the chuck table 41 is detected and the alignment of the laser beam application position is carried out as described above, the chuck table 41 is moved to a laser beam application area where the condenser 422 of the laser beam application means 42 for applying a laser beam is located as shown in FIG. 4(a) to bring one end (left end in FIG. 4(a)) of the predetermined dividing line 21 to a position right below the condenser 422 of the laser beam application means 42. The chuck table 41, that is, the semiconductor wafer 2 is then moved in the direction indicated by the arrow X1 in FIG. 4(a) at a predetermined feed rate while a pulse laser beam having permeability for a silicon wafer is applied from the condenser 422. When the application position of the condenser 422 reaches the other end of the dividing line 21 as shown in FIG. 4(b), the application of the pulse laser beam is suspended and the movement of the chuck table 41, that is, the semiconductor wafer 2 is stopped. In this deteriorated layer forming step, the focal point P of the pulse laser beam is set to a position near the front surface 2a (under surface) of the semiconductor wafer 2. As a result, a deteriorated layer 210 is exposed to the front surface 2a (under surface) of the semiconductor wafer 2 and formed from the front surface 2a toward the inside. This deteriorated layer 210 is formed as a molten and re-solidified layer.

The processing conditions in the above deteriorated layer forming step are set as follows, for example.
Light source: LD excited Q switch Nd:YVO4 laser
Wavelength: pulse laser beam having a wavelength of 1,064 nm
Pulse output: 10 µJ
Focal spot diameter: 1 µm
Repetition frequency: 100 kHz
Processing-feed rate: 100 mm/sec When the semiconductor wafer 2 is thick, as shown in FIG. 5, the above-described deteriorated layer forming step is carried out several times by changing the focal point P stepwise so as to form a plurality of deteriorated layers 210. For example, as the thickness of the deteriorated layer formed once under the above processing conditions is about 50 µm, the above deteriorated layer forming step is carried out three times to form deteriorated layers 210 having a total thickness of 150 µm. In the case of a wafer 2 having a thickness of 300 µm, six deteriorated layers 210 may be formed from the front surface 2a to the rear surface 2b along the dividing lines 21 in the inside of the semiconductor wafer 2. The above deteriorated layer 210 may be formed only in the inside of the semiconductor wafer 2 so as not to be exposed to the front surface 2a and the rear surface 2b.

Figure 6:
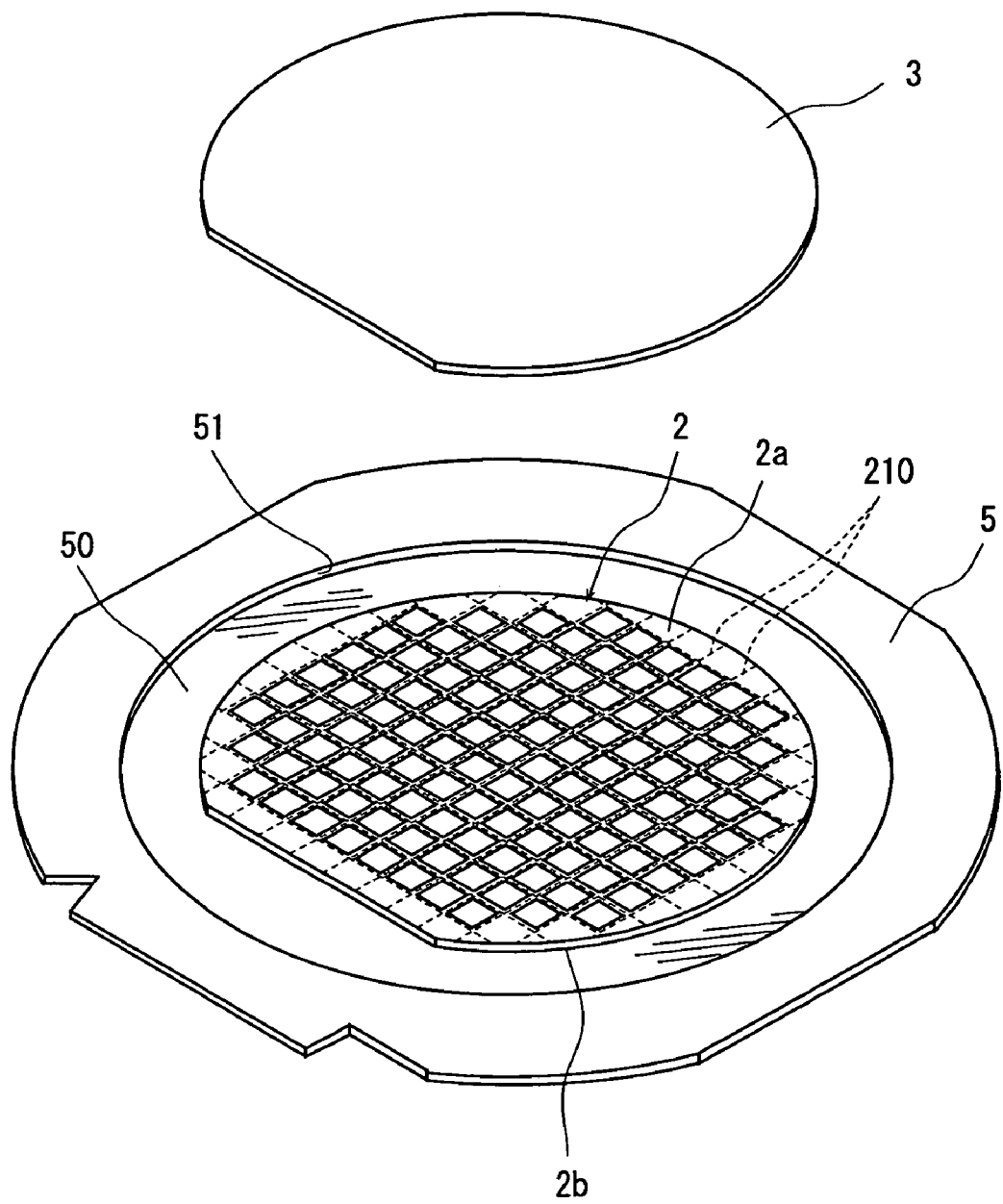
FIG. 6 is an explanatory diagram showing the wafer supporting step in the wafer dividing method of the present invention.

After the above deteriorated layer forming step is carried out along all the dividing lines 21 formed in the predetermined direction of the semiconductor wafer 2 as described above, the chuck table 41 is turned at 90° to carry out the above deteriorated layer forming step along dividing lines 21 formed in a direction perpendicular to the above predetermined direction. After the above deteriorated layer forming step is carried out along all the dividing lines 21 formed on the semiconductor wafer 2 as described above, next comes a wafer supporting step for putting the rear surface of the wafer on the surface of an adhesive tape which is affixed to an annular frame and whose adhesive strength is reduced by applying ultraviolet radiation thereto. That is, as shown in FIG. 6, the rear surface 2b of the semiconductor wafer 2 is put on the surface of the adhesive tape 50 whose peripheral portion is affixed to the annular frame 5 so as to cover its inner opening 51. Then, the protective member 3 is peeled off from the front surface 2a of the semiconductor wafer 2. The adhesive tape 50 has an adhesive layer whose adhesive strength is reduced by applying ultraviolet radiation onto the surface of a 70 µm-thick sheet backing made of a synthetic resin such as polyvinyl chloride (PVC). As the adhesive tape having an adhesive layer whose adhesive strength is reduced by applying ultraviolet radiation thereto may be used the D series tape manufactured and marketed by Lintec Corporation, the UC series tape manufactured and marketed by The Furukawa Electric Co., Ltd. and the FSL-N400 series tape manufactured and marketed by Sumitomo Bakelite Co., Ltd.

Figure 7:
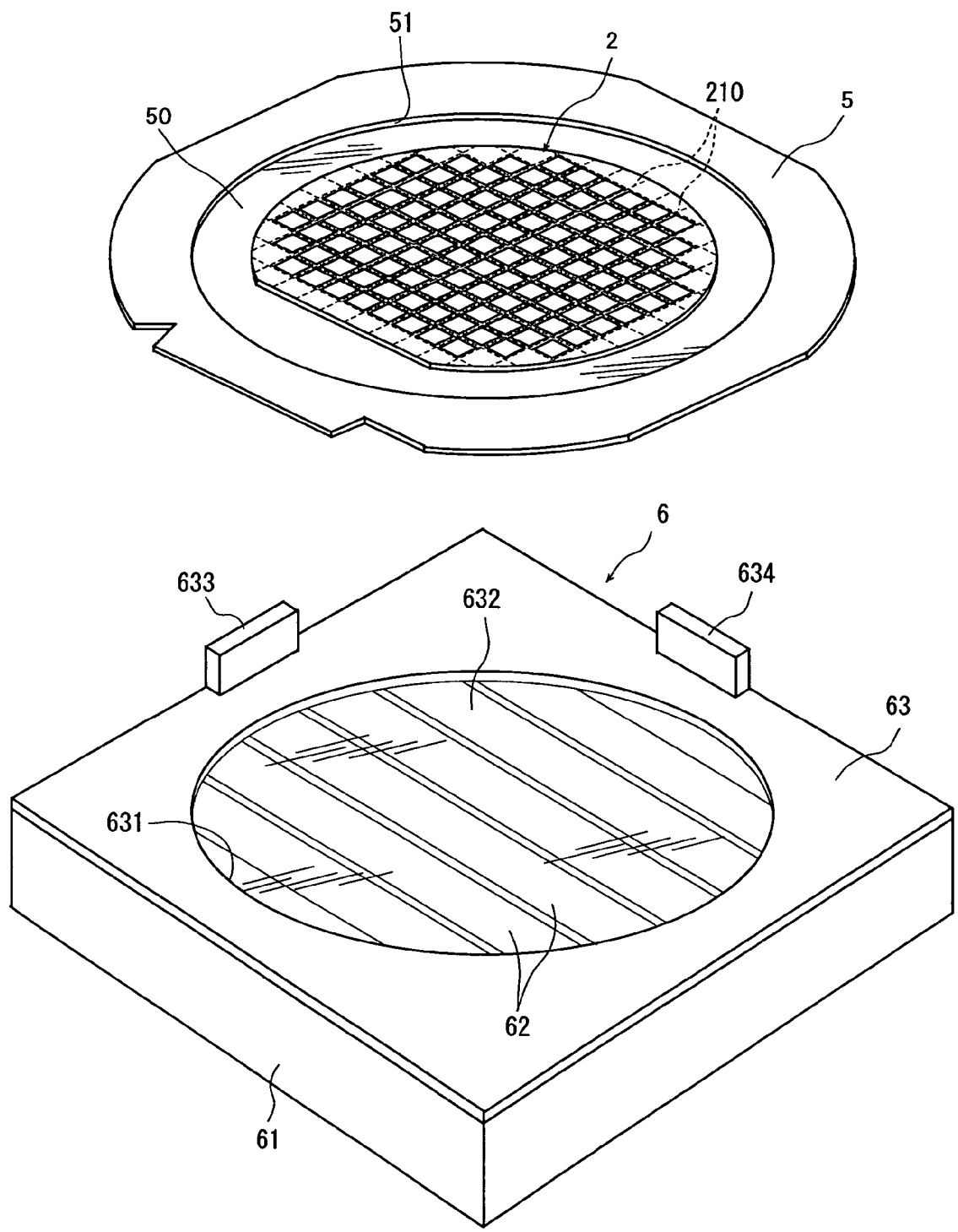
FIG. 7 is a perspective view of an ultraviolet illuminator for carrying out the chips-spacing forming step in the wafer dividing method of the present invention.

The above wafer supporting step is followed by a chips-spacing forming step for dividing the semiconductor wafer 2 into individual chips along the dividing lines 21 where the deteriorated layer 210 has been formed and widening the space between adjacent chips by applying ultraviolet radiation to the adhesive tape 50 to which the semiconductor wafer 2 in which the deteriorated layers 210 have been formed along the dividing lines 21 has been affixed to reduce the adhesive strength of the adhesive tape 50 and shrink the shrink area between the inner periphery of the annular frame 5 and the area to which the semiconductor wafer 2 has been affixed, of the adhesive tape 50. This chips-spacing forming step is carried out by using an ultraviolet illuminator 6 shown in FIG. 7 and FIGS. 8(a) and 8(b). The ultraviolet illuminator 6 shown in FIG. 7 and FIGS. 8(a) and 8(b) comprises a substantially rectangular parallelepiped lamp housing 61 which is open at the top, a plurality of ultraviolet lamps 62 installed in the lamp housing 61 and a frame holding plate 63 mounted on the top surface of the lamp housing 61. An opening 631 corresponding to the opening 51 of the annular frame 5 is formed in the frame holding plate 63, and transparent glass 632 is fitted in the opening 631. Two positioning members 633 and 634 for restricting the periphery of the annular frame 5 are provided on the top surface of the frame holding plate 63.

Figure 8:
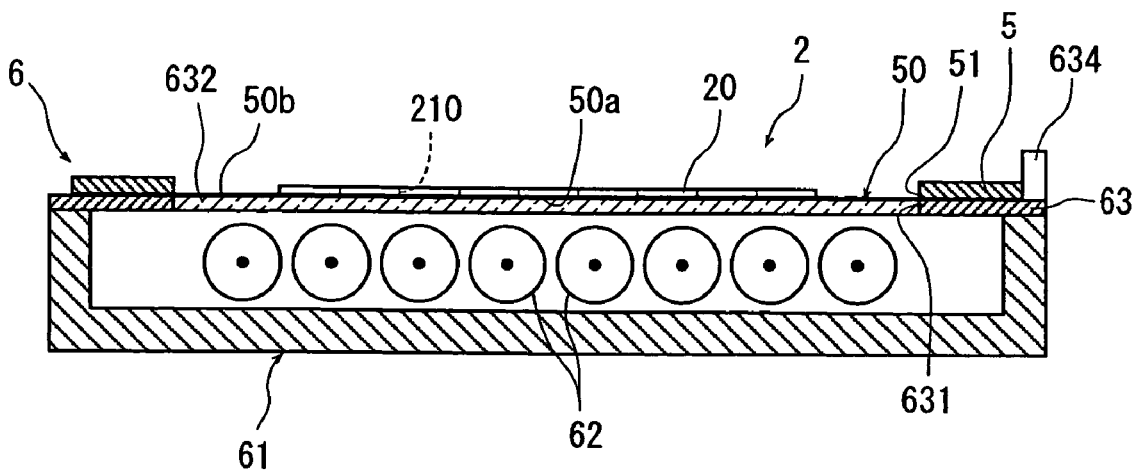
FIGS. 8(a) and 8(b) are explanatory diagrams showing the chips-spacing forming step in the wafer dividing method of the present invention.
Figure 8:
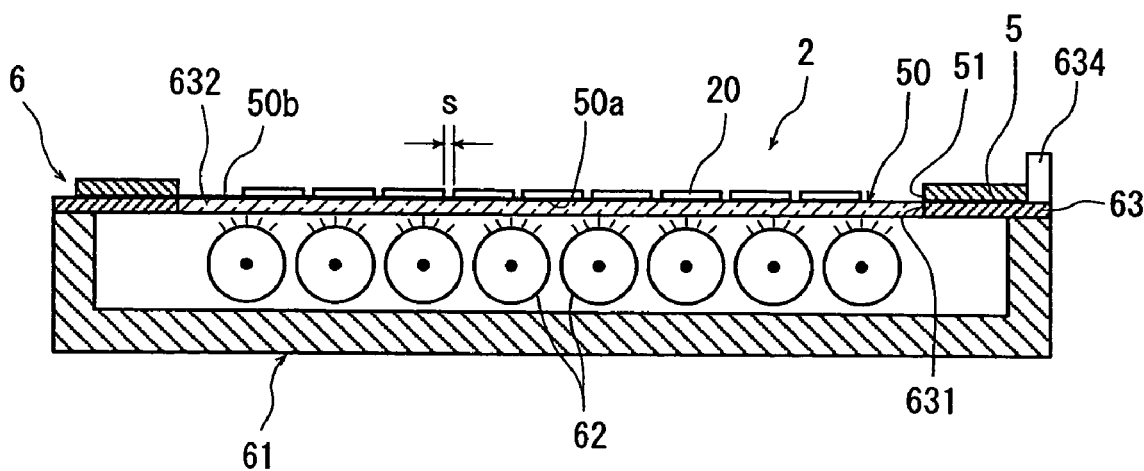

The annular frame 5 supporting the semiconductor wafer 2 (the deteriorated layer 210 is formed along the dividing lines 21) through the adhesive tape 50 is placed on the frame holding plate 63 of the ultraviolet illuminator 6 constituted as described above. At this point, the annular frame 5 can be positioned at a predetermined location by bringing the outer periphery of the annular frame 5 into contact with the two positioning members 633 and 634. After the annular frame 5 is positioned at the predetermined location of the frame holding plate 63, the opening 631 formed in the frame holding plate 63 is aligned with the opening 51 of the annular frame 5, as shown in FIG. 8(a). Then, the ultraviolet lamps 62 are turned on as shown in FIG. 8(b). By turning on the ultraviolet lamps 62, ultraviolet radiation is applied to the adhesive tape 50 mounted on the annular frame 5 through the transparent glass 632. As a result, the adhesive strength of the adhesive tape 50 is reduced. The adhesive tape 50 whose adhesive strength is reduced by applying ultraviolet radiation thereto has properties that it generates heat and cures by application of the ultraviolet radiation. The shrink area 50b between the inner periphery of the opening 51 of the annular frame 5 and the area (wafer affixing area) 50a to which the semiconductor wafer 2 has been affixed, of the adhesive tape 50 mounted on the annular frame 5 has a large shrinkage factor because there is no heat transfer member. Therefore, the wafer affixing area 50a is expanded by the shrinkage of the above shrink area 50b, whereby tensile force acts radially on the semiconductor wafer 2 that is affixed to the above wafer affixing area 50a. When tensile force thus acts radially on the semiconductor wafer 2, as the deteriorated layers 210 formed along the dividing lines 21 have reduced strength, the semiconductor wafer 2 is divided into individual semiconductor chips 20 along the deteriorated layers 210, and the space S between adjacent individual semiconductor chips 20 is widened.

Figure 9:
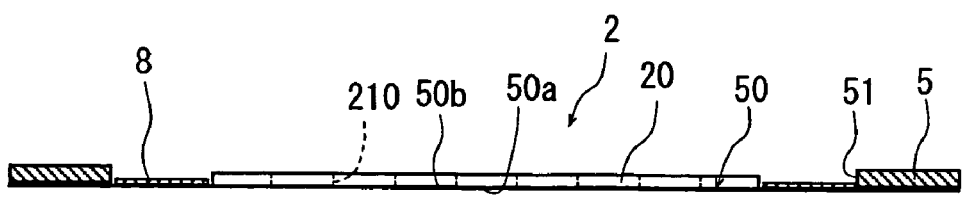
FIG. 9 is a sectional view showing another adhesive tape mounted on an annular frame.

To shrink the above shrink area 50b of the adhesive tape 50 effectively, as shown in FIG. 9, an annular shrinking member 8 composed of a 20 to 30 μm thick sheet made of a synthetic resin such as polyethylene terephthalate (PET) which shrinks by heating is desirably mounted on the surface of the shrink area 50b.

Figure 10:
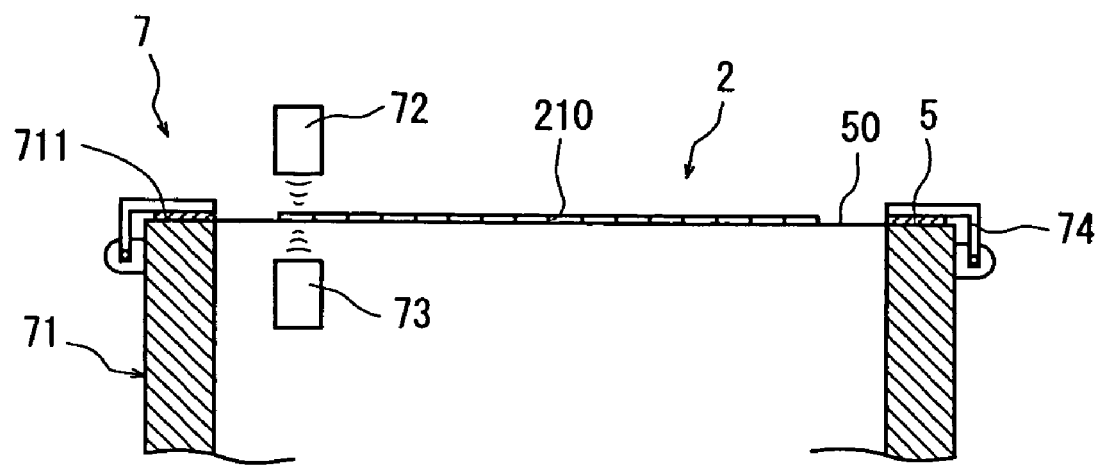
FIG. 10 is an explanatory diagram showing the wafer dividing step in the wafer dividing method of the present invention.

When it is difficult to divide the semiconductor wafer 2 into individual semiconductor chips 20 along the dividing lines 21 where the deteriorated layer 210 has been formed in the above chips-spacing forming step, it is desired that the step of dividing the semiconductor wafer 2 into individual semiconductor chips 20 along the dividing lines 21 where the deteriorated layer 210 has been formed, by exerting external force to the semiconductor wafer 2 affixed to the adhesive tape 50 should be carried out before the chips-spacing forming step. This wafer dividing step is carried out by using an ultrasonic dividing apparatus 7 shown in FIG. 10 in the illustrated embodiment. The ultrasonic dividing apparatus 7 is composed of a cylindrical base 71, a first ultrasonic oscillator 72 and a second ultrasonic oscillator 73. The cylindrical base 71 constituting the ultrasonic dividing apparatus 7 has a top surface as a placing surface 711 for placing the above annular frame 5, and the above annular frame 5 is placed on the placing surface 711 and fixed by clamps 74. This base 71 is constituted to be moved in a horizontal direction and in a direction perpendicular to the sheet in FIG. 10, and to be turned by a moving means that is not shown. The first ultrasonic oscillator 72 and the second ultrasonic oscillator 73 constituting the ultrasonic dividing apparatus 7 are opposed to each other in such a manner that the semiconductor wafer 2 supported to the annular frame 5 fixed on the placing surface 711 of the cylindrical base 71 through the adhesive tape 50 is interposed between them and generate longitudinal waves (compressional waves) having a predetermined frequency.

To carry out the above wafer dividing step by using the ultrasonic dividing apparatus 7 constituted as described above, the adhesive tape 50 side of the annular frame 5 supporting the semiconductor wafer 2 (the deteriorated layer 210 is formed along the dividing lines 21) through the adhesive tape 50 is placed on the placing surface 711 of the cylindrical base 71 and fixed by the clamps 74. Thereafter, the base 71 is operated by the moving means (not shown) to bring one end (left end in FIG. 10) of a predetermined dividing line 21 formed on the semiconductor wafer 2 to a position where ultrasonic waves acts thereon from the first ultrasonic oscillator 72 and the second ultrasonic oscillator 73. The first ultrasonic oscillator 72 and the second ultrasonic oscillator 73 are then activated to generate longitudinal waves (compressional waves) having a frequency of, for example, 28 kHz and the base 71 is moved in the direction indicated by the arrow at a feed rate of, for example, 50 to 100 mm/sec. As a result, ultrasonic waves generated from the first ultrasonic oscillator 72 and the second ultrasonic oscillator 73 are applied to the front surface 2a and rear surface 2b of the semiconductor wafer 2 along the dividing line 21, whereby the semiconductor wafer 2 is divided along the dividing line 21 whose strength has been reduced by the formation of the deteriorated layer 210. After the wafer dividing step is carried out along the predetermined dividing line 21, the base 71 is moved (indexing-fed) a distance corresponding to the interval between the dividing lines 21 in the direction perpendicular to the sheet to carry out the above wafer dividing step. After the above wafer dividing step is carried out along all the dividing lines 21 extending in the predetermined direction, the base 71 is turned at 90° to carry out the above wafer dividing step along dividing lines 21 formed on the semiconductor wafer 2 in a direction perpendicular to the above predetermined direction, whereby the semiconductor wafer 2 is divided into individual chips 20. Since the rear surfaces of the obtained chips adhere to the adhesive tape 50, they do not fall apart and the state of the wafer is maintained.

The following dividing methods may be employed to carry out the wafer dividing step besides the above dividing method.

That is, a method in which the semiconductor wafer 2 (the deteriorated layer 210 is formed along the dividing lines 21) mounted on the adhesive tape 50 is placed on a soft rubber sheet and then, the top surface of the semiconductor wafer 2 is pressed with a roller to divide the semiconductor wafer 2 along the dividing lines 21 whose strength has been reduced by the formation of the deteriorated layers 210 may be employed. Alternatively, a method in which a pressing member is applied along the dividing lines 21 whose strength has been reduced by the formation of the deteriorated layers 210 or a method in which a heat shock is given by applying a laser beam along the dividing lines 21 whose strength has been reduced by the formation of the deteriorated layers 210 may be employed.

By carrying out the wafer dividing step before the above chips-spacing forming step, the semiconductor wafer 2 can be divided into individual semiconductor chips 20 along the dividing lines 21 where the deteriorated layer 210 has been formed without fail and the space S between adjacent semiconductor chips 20 can be surely formed in the chips-spacing forming step.

After the chips-spacing forming step, the semiconductor wafer 2 separated into individual semiconductor chips 20 is carried to the next pick-up step in a state where it has been affixed to the adhesive tape 50 mounted on the annular frame 5. Since the space S is formed between adjacent individual semiconductor chips 20 in the above chips-spacing forming step at this point, the adjacent chips are not rubbed with each other during conveyance, thereby making it possible to prevent the chips from being damaged by rubbing. In the pick-up step, as the adhesive strength of the adhesive tape 50 exposed to ultraviolet radiation in the above chips-spacing forming step is reduced, the individual semiconductor chips 20 can be easily picked up.

Since the space S between adjacent semiconductor chips 20 can be expanded by applying ultraviolet radiation to the adhesive tape 50 to shrink the shrink area 50*b* of the adhesive tape 50 and the adhesive strength of the adhesive tape 50 can be reduced in the chips-spacing forming step in the illustrated embodiment, the number of steps does not increase. Since ultraviolet radiation is simply applied to the adhesive tape 50 in the chips-spacing forming step, a special apparatus for shrinking the shrink area 50*b* of the adhesive tape 50 is not required.

What is claimed is:

1. A method of dividing a wafer having a plurality of dividing lines which are formed in a lattice pattern on the front surface and devices which are formed in a plurality of areas sectioned by the plurality of dividing lines, into individual chips along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is affixed to an annular frame and whose adhesive strength is reduced by applying ultraviolet radiation thereto after the deteriorated layer forming step; and a chips-spacing forming step for reducing the adhesive strength of the adhesive tape and shrinking a shrink area between the inner periphery of the annular frame and the area to which the wafer has been affixed, of the adhesive tape by applying ultraviolet radiation to the adhesive tape to which the wafer having the deteriorated layers along the dividing lines has affixed so as to divide the wafer into individual chips along the dividing lines where the deteriorated layer has been formed and widen the space between adjacent chips.

2. A method of dividing a wafer having a plurality of dividing lines which are formed in a lattice pattern on the front surface and devices which are formed in a plurality of areas sectioned by the plurality of dividing lines, into individual chips along the dividing lines, comprising:

a deteriorated layer forming step for forming a deteriorated layer in the inside of the wafer along the dividing lines by applying a laser beam of a wavelength having permeability for the wafer along the dividing lines;

a wafer supporting step for putting the rear surface of the wafer on the surface of an adhesive tape which is affixed to an annular frame and whose adhesive strength is reduced by applying ultraviolet radiation thereto after the deteriorated layer forming step;

a wafer dividing step for dividing the wafer into individual chips along the dividing lines where the deteriorated layer has been formed by exerting external force to the wafer on the adhesive tape; and a chips-spacing forming step for reducing the adhesive strength of the adhesive tape and shrinking a shrink area between the inner end of the annular frame and the area to which the wafer has been affixed, of the adhesive tape by applying ultraviolet radiation to the adhesive tape to which the wafer divided into individual chips along the dividing lines has been affixed so as to widen the space between adjacent chips.

* * * * *